US006188251B1

(12) United States Patent
Priemer et al.

(10) Patent No.: US 6,188,251 B1
(45) **Date of Patent: *Feb. 13, 2001**

(54) ANALOG VOLTAGE MAXIMUM SELECTION AND SORTING CIRCUITS

(76) Inventors: Roland Priemer, 650 Devonshire La., Des Plaines, IL (US) 60018; Thomas S. Dranger, 22300 Nichols Dr., Sauk Village, IL (US) 60411

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/053,673

(22) Filed: Apr. 1, 1998

(51) Int. Cl.[7] .................................................... H03K 5/22
(52) U.S. Cl. ................................ 327/63; 327/69; 327/71
(58) Field of Search ................................ 327/62, 63, 68, 327/69, 71, 74, 75, 407, 408

(56) References Cited

U.S. PATENT DOCUMENTS

| | | | | |
|---|---|---|---|---|
| 3,609,565 | * | 9/1971 | Arnold | 327/71 |
| 4,419,595 | * | 12/1983 | Reiner | 327/63 |
| 5,408,194 | * | 4/1995 | Steinbach et al. | 327/355 |
| 5,414,310 | * | 5/1995 | Fattasuro | 327/62 |
| 5,905,387 | * | 5/1999 | Chinosi et al. | 327/62 |

OTHER PUBLICATIONS

"A Voltage Based Winner Takes All Circuit For Analog Neural Networks", J. Starzyk and Y. Jan, School of Electrical Engineering and Computer Science, Ohio University, Athens, Ohio, pp. 501–504, 1997.

* cited by examiner

*Primary Examiner*—Timothy P. Callahan
*Assistant Examiner*—Hai L. Nguyen

(57) ABSTRACT

An analog circuit is provided to output the maximum voltage from among the set of analog voltages produced by a set of voltage sources connected to the input terminals of the circuit. The circuit has a number of output terminals equal to the number of input terminals. For each input terminal there is one corresponding output terminal. From among the set of analog voltages at the input terminals of the circuit, the analog circuit finds which voltage is the maximum voltage, and it produces this voltage at the output terminal corresponding to the input terminal having the maximum voltage, while setting the other output terminal voltages to zero volts. Through parallel processing of the input voltages, the analog circuit finds the largest input voltage. The analog circuit is made from inexpensive and readily available components suitable for large scale integration fabrication. Also, connection circuitry under logic signal control is provided so that at an additional output terminal of the analog circuit, the analog circuit sequentially outputs in descending voltage value order the set of voltages at the input terminals, thereby, sorting the set of voltages at the input terminals. Moreover, there is provided additional logic circuitry that outputs a code that identifies which input terminal has the voltage produced at the additional output, and therefore, as the series of input voltages appears at the additional output, as time passes, in order of descending value, a logic coder produces a corresponding series of codes which identify the input terminals in order of descending value of voltages at the input terminals.

28 Claims, 8 Drawing Sheets

ANALOG VOLTAGE MAXIMUM SELECTION AND SORTING CIRCUITS

FIELD OF THE INVENTION

The present invention relates to an analog circuit that finds from among a set of analog voltages applied to its input terminals which input terminal has applied to it the maximum analog voltage among the set of analog voltages applied to its input terminals, and the analog circuit outputs the maximum voltage value found. The present invention also relates to an analog circuit controlled by logic signals that sorts the set of analog voltages at the input terminals in descending order of the value of the analog voltages in the set.

BACKGROUND OF THE INVENTION

In fuzzy logic systems there is a need to find the largest voltage produced by a set of M voltage sources. In pulse position demodulation there is a need to find which voltage pulse in a set of M voltage pulses has the greatest voltage value. In artificial neural networks there is a need to output a response depending on the strongest input. In processes involving comparison of a plurality of signals such as in: anti-lock braking, power distribution, synchronization, resource management, multi-regulation and multi-equalization (for example in blending of chemicals), fuel mixture control in multi-carburetor applications, color mixing control, automated guidance, balancing and dynamic balancing, tracking, dispensing, scheduling distribution of materials and resources, tuning, metering, stabilization, quality control, medical monitoring, and others there is a need to sort to some extent these signals resulting in differing actions. In contests, servicing, testing, arranging, and general purpose computation there is a need to find the largest voltage, find the next to the largest voltage, and even sort all of the M analog voltages produced by a set of M voltage sensors, sending units, or sources.

By analog to digital conversion, these tasks can be accomplished with a digital computer, and there are many well known maximum finding and sorting algorithms. Such algorithms are distinguished one from another by their computational complexity and the time required to sort.

We provide a parallel processing analog circuit and means to sort a set of analog voltage sources. The complexity of the analog circuit is proportional to the number of voltage sources to be sorted. The analog circuit is constructed of simple and readily available components making it easy and inexpensive to produce.

In the prior art there are analog circuits that output the maximum voltage from among a set of analog input voltages. However, these so called, "winner take all", circuits do not identify which voltage source produces the maximum voltage, and they do not sort analog voltage sources.

SUMMARY OF THE INVENTION

In a first aspect of the present invention there is provided a circuit comprising N Q-element inputs, each input having a voltage $W_i$ applied thereto, where N is any positive integer. Also provided are first and second Q-element outputs. The first Q-element output provides a voltage $V_x$ such that $$V = \begin{cases} \sigma, & \sigma > 0 \\ 0, & \sigma \leq 0 \end{cases}$$

where $$\sigma = \sum_{i=1}^{N} W_i.$$

The second Q-element output provides a voltage $V_y$ such that $$V_y = -V_x.$$

In another aspect of the present invention there is provided a circuit for identifying a highest voltage of a plurality of voltages comprising a plurality of input terminals, each input terminal having a voltage applied thereto and a plurality of output terminals, each of the output terminals associated with a corresponding input terminal. A maximum voltage identification circuit determines the highest voltage of each of the input terminals and provides an output voltage on the output terminal associated with the highest voltage. The maximum voltage identification circuit provides a predetermined voltage on the remaining output terminals.

For an understanding of the principles of the invention, reference is made to the following description of example embodiments of the invention as illustrated in the accompanying drawings.

DETAILED DESCRIPTION OF THE PREFERRED EMBODIMENT

Figure 1:
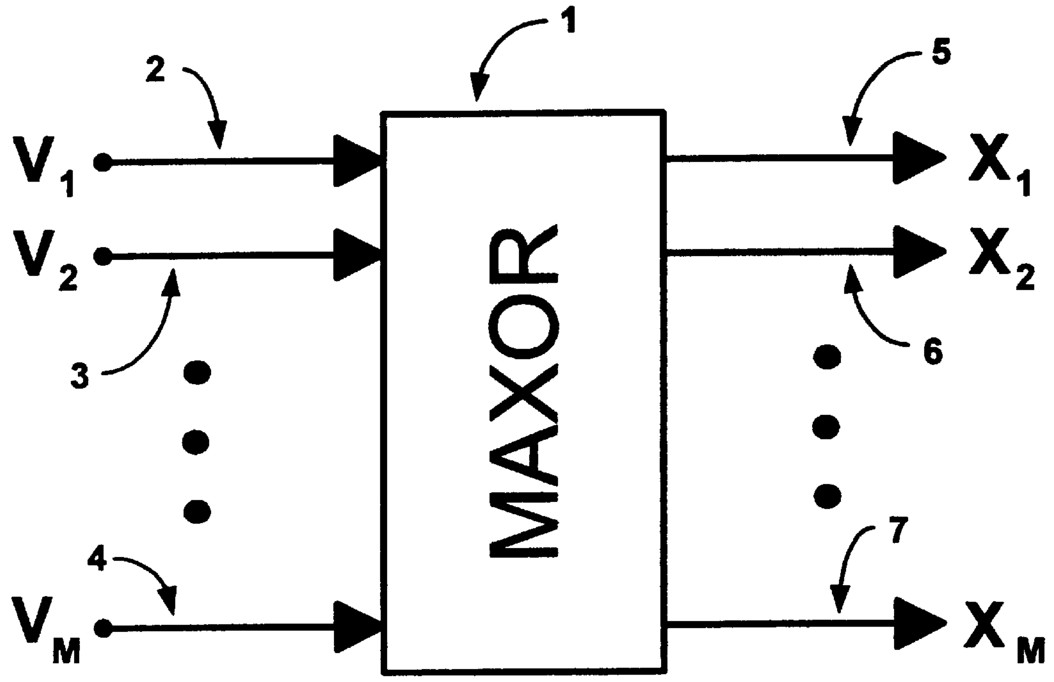
FIG. 1 is an illustration of a MAXOR circuit in accordance with a first embodiment of the present invention.

While this invention is susceptible of embodiment in many different forms, there is shown in the drawings and will herein be described in detail a preferred embodiment of the invention with the understanding that the present disclosure is to be considered as an example of the principles of the present invention and is not intended to limit the broad aspect of the invention to the embodiments illustrated.

In FIG. 1 is shown a block diagram representation of a device 1 herein called a "MAXOR." The MAXOR has M input terminals. To the first input terminal 2 is applied the input voltage $V_1$, to the second input terminal 3 is applied the input voltage $V_2$, and so on through the Mth input terminal 4, to which is applied the input voltage $V_M$. All input voltages have nonnegative values in the range $0<V_i \leqq V^+$, i=1, . . . , M, where $V^+$ is limited by the positive power supply voltage. Later, the case where input voltages can be positive or negative will be considered.

The MAXOR has a number of output terminals equal to the number of input terminals. The first output terminal 5 produces the output voltage $X_1$, the second output terminal 6 produces the output voltage $X_2$, and so on through the Mth output terminal 7 that produces the output voltage $X_M$.

The MAXOR operates such that there is a one-to-one correspondence between the first input terminal 2 and the first output terminal 5, there is a one-to-one correspondence between the second input terminal 3 and the second output terminal 6, and this continues through the last input terminal 4 that is in one-to-one correspondence with the last output terminal 7.

Now, assume that a set of M input voltages, $V_1, V_2, \ldots, V_M$, are applied to the M input terminals of the MAXOR. And, among the set of input voltages one voltage $V_k$ is the largest voltage, so that $V_k > V_i$, i=1, . . . , M, i≠k. The MAXOR has a means such that the output terminal that corresponds to the input terminal to which is applied the input voltage $V_k$ produces the output voltage $X_k=V_k$, while all other output voltages are zero volts. Therefore, the MAXOR has found the maximum input voltage among the set of input voltages, and it has identified the input terminal to which is connected the voltage source that produces the maximum voltage among the set of M voltage sources that apply the M input voltages to the MAXOR.

Figure 2:
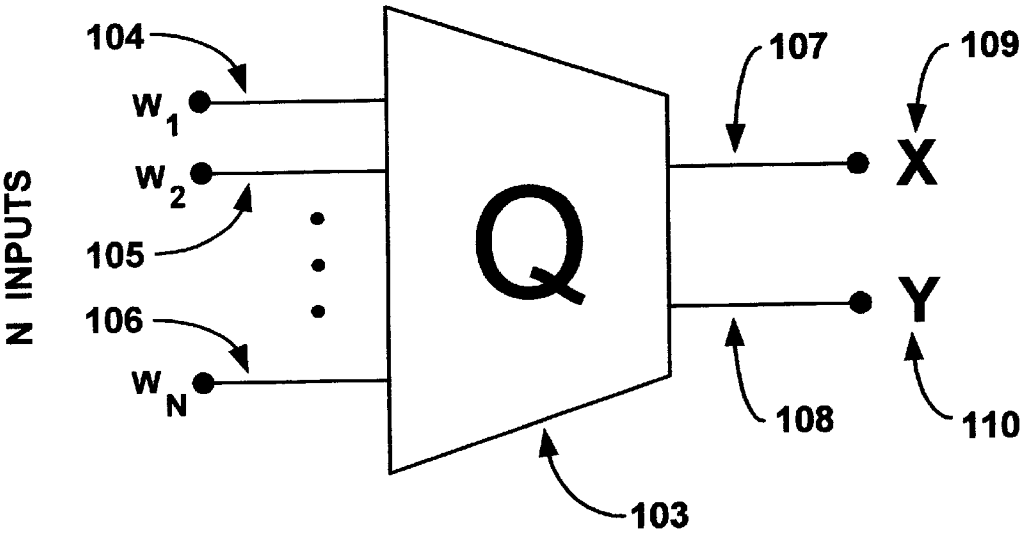
FIG. 2 is an illustration of a Q-element in accordance with an embodiment of the present invention.

An embodiment of the MAXOR is based on the operation of a device herein called a Q-element. In FIG. 2 is shown a block diagram 103 of a Q-element having N input terminals. A Q-element can have any integer number of inputs, such that N is greater than one. To the first input terminal 104 can be applied an input voltage $W_1$, to the second input terminal 105 can be applied an input voltage $W_2$, and so on through the Nth input terminal to which can be applied an input voltage $W_N$. Within the Q-element there is a means to sum the N input voltages and rectify the sum. Let σ denote the sum of the N Q-element input voltages so that $$\sigma = \sum_{i=1}^{N} W_i$$

A Q-element has two output terminals. The first output terminal 107 produces the output voltage 109, labeled X, and the second output terminal 108 produces the output voltage 110, labeled Y. Within the Q-element there is a means to produce the output voltage X such that $$X = \begin{cases} \sigma, & \sigma > 0 \\ 0, & \sigma \le 0 \end{cases}$$

Also, within the Q-element there is means to produce the output voltage Y such that $$Y=-X$$

so that the output voltages X and Y have equal magnitudes and opposite signs.

Figure 3:
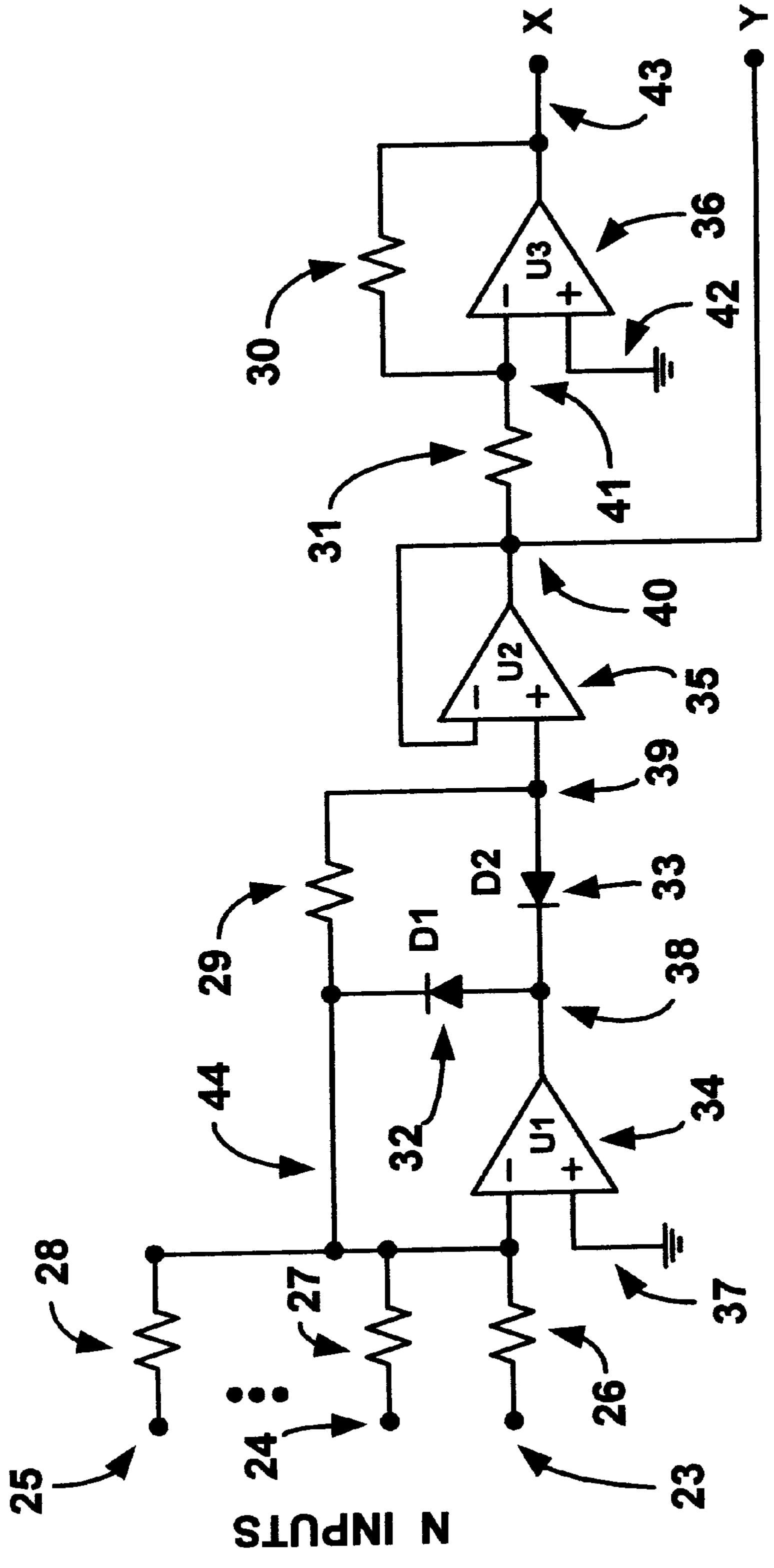
FIG. 3 is a circuit diagram of a Q-element in accordance with an embodiment of the present invention.

An example circuit of the embodiment of a Q-element is shown in FIG. 3. The circuit has N input terminals, where N is any integer such that N is greater than one. The first input terminal 23 is one terminal of a resistor 26, and the other terminal of the resistor 26 is connected to node 44. The second input terminal 24 is one terminal of a resistor 27, and the other terminal of the resistor 27 is connected to the node 44. The Nth input terminal 25 is one terminal of a resistor 28, and the other terminal of the resistor 28 is connected to the node 44. For every input terminal there is a resistor connected like said resistors 26, 27, and 28. The negative (inverting) input of an operational amplifier 34 (op-amp U1) is connected to the node 44, and the positive (noninverting) input of the operational amplifier 34 is connected to the circuit voltage reference (or ground) node 37. The output terminal 38 of the operational amplifier 34 is connected to the anode terminal of diode 32 (diode D1) and the cathode terminal of diode 33 (diode D2). The cathode terminal of the diode 32 is connected to the node 44. The anode terminal of the diode 33 is connected to node 39. Resistor 29 has one terminal connected to the node 44 and the other terminal connected to the node 39. The positive (noninverting) input of operational amplifier 35 (op-amp U2) is connected to the node 39. The output terminal 40 of the operational amplifier 35 is connected to its negative (inverting) input. Therefore, said op-amp U2 acts as a buffer. The voltage at said terminal 40 is the Q-element output voltage Y. One terminal of resistor 31 is connected to the said output terminal 40, and the other terminal of the resistor 31 is connected to node 41. The negative (inverting) input of an operational amplifier 36 (op-amp U3) is connected to the node 41, and the positive (noninverting) input of the operational amplifier 36 is connected to the circuit voltage reference (or ground) node 42. One terminal of resistor 30 is connected to the node 41, and the other terminal of the resistor 30 is connected to the output terminal 43 of the operational amplifier 36. The voltage at the terminal 43 is the Q-element output voltage X. All resistors in FIG. 3 have the same value, for example, 10K Ohms.

Figure 4:
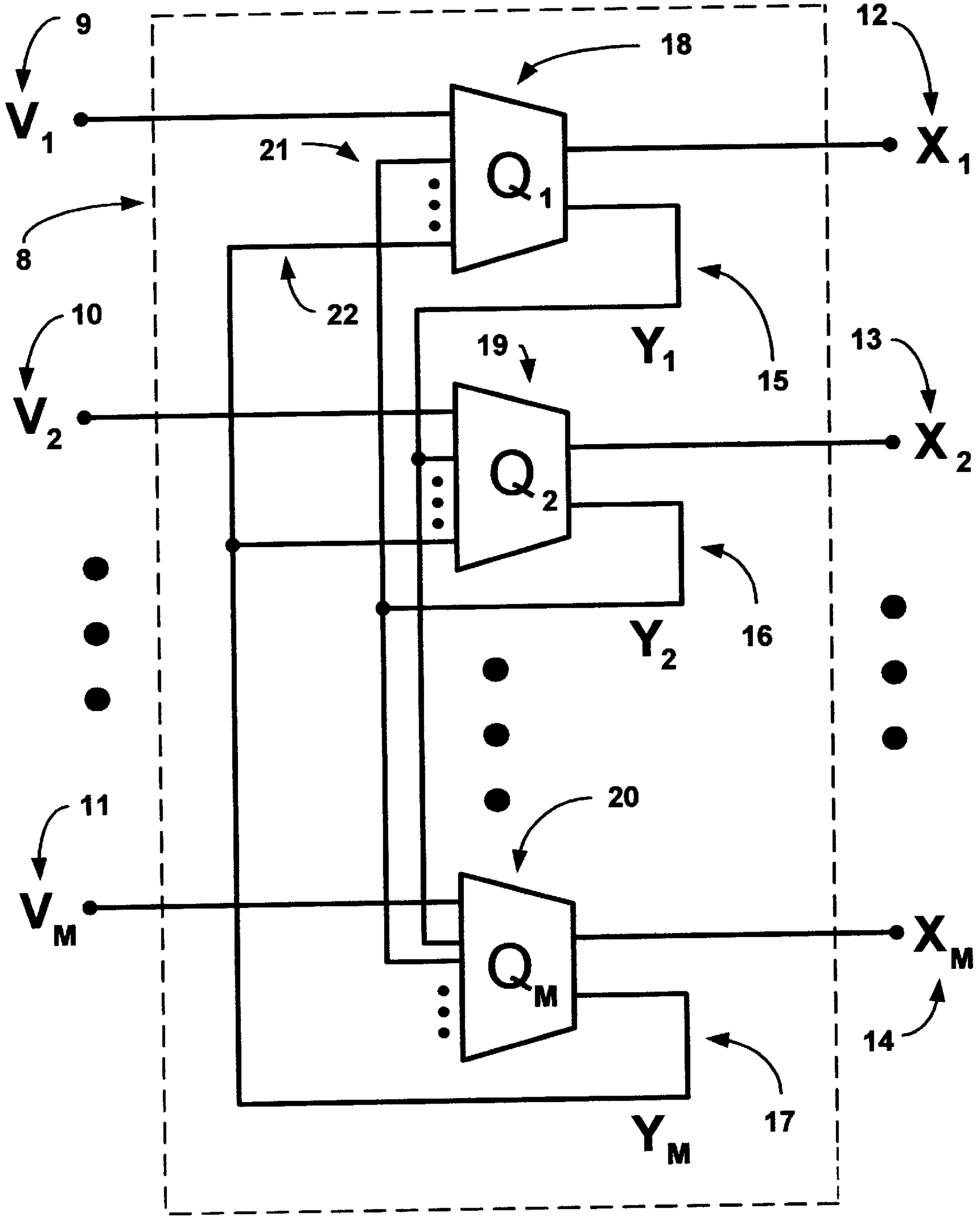
FIG. 4 is diagram of a MAXOR circuit in accordance with a second embodiment of the present invention.

FIG. 4 shows an embodiment 8 of a MAXOR having M inputs and M outputs. The input voltages are designated $V_1, V_2, \ldots, V_M$, and the output voltages are designated $X_1, X_2, \ldots, X_M$. It uses a number M of Q-elements, where the Q-elements are designated by $Q_1, Q_2, \ldots, Q_M$, and each Q-element has N=M inputs. The first MAXOR input voltage 9, which is labeled $V_1$, is the first input voltage of the first Q-element 18, which is labeled $Q_1$, and this $Q_1$ produces the first and corresponding MAXOR output voltage 12, which is labeled $X_1$. The other M−1 input voltages of $Q_1$, where 21 connects to the first of these other input voltages and 22 connects to the last of these other input voltages, are connected to the Y output voltages of all the other Q-elements, where 16, which is labeled $Y_2$ is the Y output voltage of the first of these other Q-elements and 17, which is labeled $Y_M$, is the Y output voltage of the last of these other Q-elements. The second MAXOR input voltage 10, which is labeled $V_2$, is the first input voltage of the second Q-element 19, which is labeled $Q_2$, and this $Q_2$ produces the second and corresponding MAXOR output voltage 13, which is labeled $X_2$. The other M−1 input voltages of $Q_2$ are the Y output voltages of all the other Q-elements. This arrangement exists among all the Q-elements. Thus, the last MAXOR input voltage 11, which is labeled $V_M$, is the first input voltage of the last Q-element 20, which is labeled $Q_M$, and this $Q_M$ produces the last and corresponding MAXOR output voltage 14, which is labeled $X_M$. The other M−1 input voltages of $Q_M$ are the Y output voltages of the other M−1 Q-elements.

At a Q-element, say $Q_i$, the sum of all the input voltages, say $\sigma_i$ is given by $$\sigma_i = V_i + \sum_{\substack{k=1 \\ k \neq i}}^{M} Y_k$$

for i=1, 2, . . . , M.

Referring to FIG. 4, assume a set of M input voltages $V_1$, $V_2$, . . . , $V_M$, have been applied to the M MAXOR input terminals, and that among these input voltages the positive voltage $V_k$ for some integer k in the range k=1, . . . , M, is the maximum voltage, so that $V_k > Vi$ for i=1, . . . , M and i≠k. Then, the MAXOR 8 of interconnected Q-elements in FIG. 4 settles to its only stable state, where the output voltage $X_k$ becomes $X_k = V_k$, and the other M−1 output voltages become $X_i = 0$ volts, for i=1, 2, . . . , M and i≠k.

Figure 5:
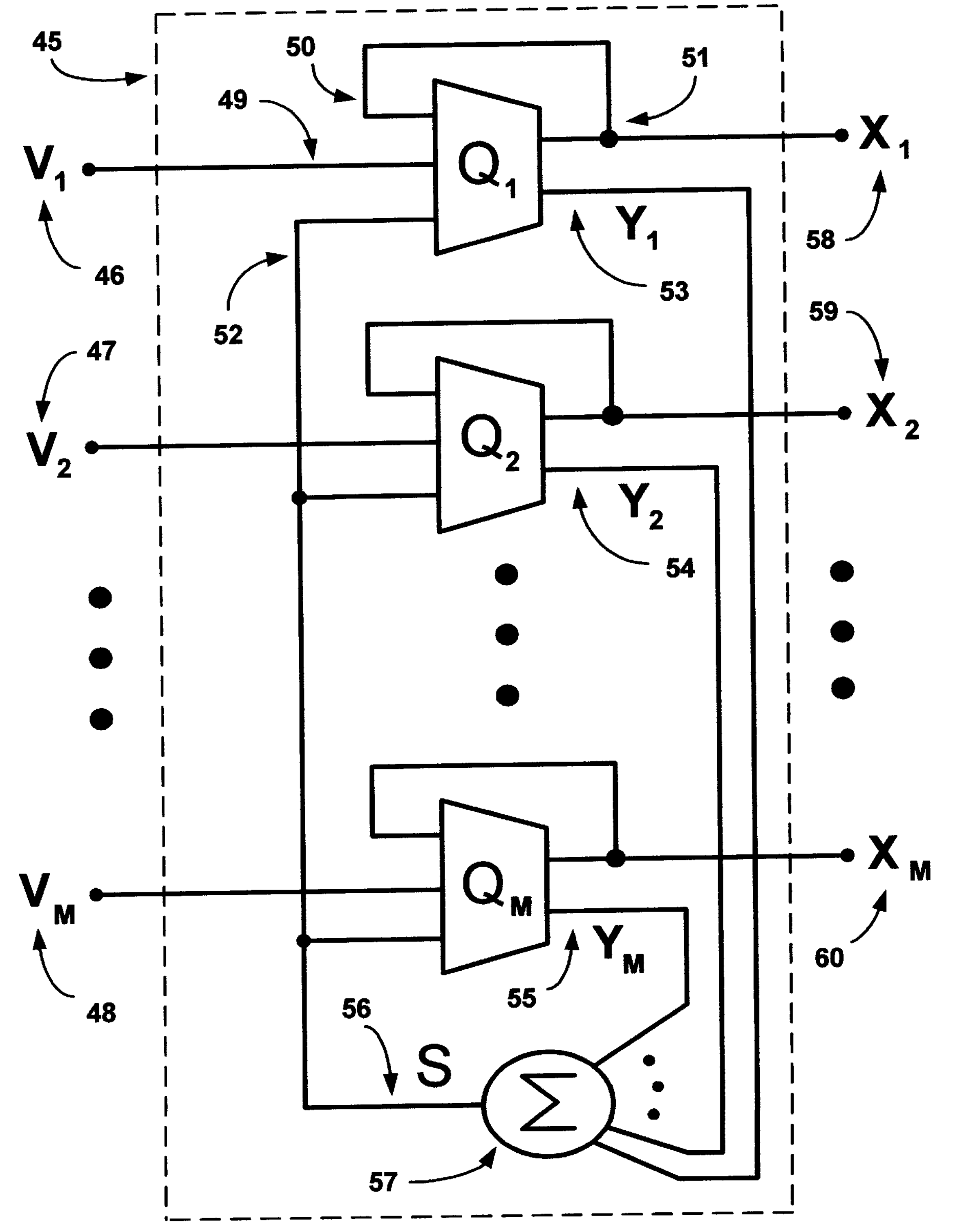
FIG. 5 is diagram of a MAXOR circuit in accordance with a third embodiment of the present invention.

FIG. 5 shows another embodiment 45 of a MAXOR having M inputs and M outputs. This embodiment requires significantly fewer connections and conductors than the embodiment given in FIG. 4 when M is large. As in FIG. 4, the input voltages are designated $V_1$, $V_2$, . . . , $V_M$, and the output voltages are designated $X_1$, $X_2$, . . . , $X_M$. It uses a number M of Q-elements, where the Q-elements are designated by $Q_1$, $Q_2$, . . . , $Q_M$, and each Q-element has N=3 inputs.

Referring to FIG. 5, there is a conventional summing means 57 that produces at its output terminal 56 the voltage that is labeled S, which is the sum of the Y output voltages of the M Q-elements, where $Y_1$ is the voltage at the output terminal 53 of the first Q-element $Q_1$, and $Y_M$ is the voltage at the output terminal 55 of the last Q-element, $Q_M$, so that $$S = \sum_{i=1}^{M} Y_i$$

The first Q-element, $Q_1$, has one input terminal 50 connected to the Q-element's output terminal 51 that produces the output voltage 58, which is labeled $X_1$. To the second input terminal 49 of $Q_1$ is applied the first MAXOR input voltage 46, which is labeled $V_1$. The third input terminal 52 of $Q_1$ is connected to the output terminal 56 of the summing means 57. Each of the remaining Q-elements of FIG. 5 is similarly connected.

Within each Q-element, say $Q_i$, the σ voltage, as defined in the previous discussion about the Q-element shown in FIG. 2, is given by the sum of Q-element input voltages, so that for the Q-elements of FIG. 5 we get $$\sigma_i = X_i + V_i + S$$

for i=1, . . . , M. Since the voltage S contains a voltage term $Y_i = -X_i$, the $\sigma_i$ voltages of the Q-elements in FIG. 5 are equivalent to the $\sigma_i$ of the Q-elements in FIG. 4. Therefore, the relationship between the inputs $V_1$, $V_2$, . . . , $V_M$, and the outputs $X_1$, $X_2$, . . . , $X_M$, are functionally equivalent in FIG. 4 and FIG. 5, and therefore, the apparatus represented in FIG. 5 functions as a MAXOR.

While a MAXOR outputs the largest voltage among the plurality of voltages applied to the MAXOR inputs, and a MAXOR, by virtue of producing only one nonzero output voltage, identifies which MAXOR input terminal has the largest positive input voltage applied to it, a MAXOR by itself cannot sort the input voltage sources.

Figure 6:
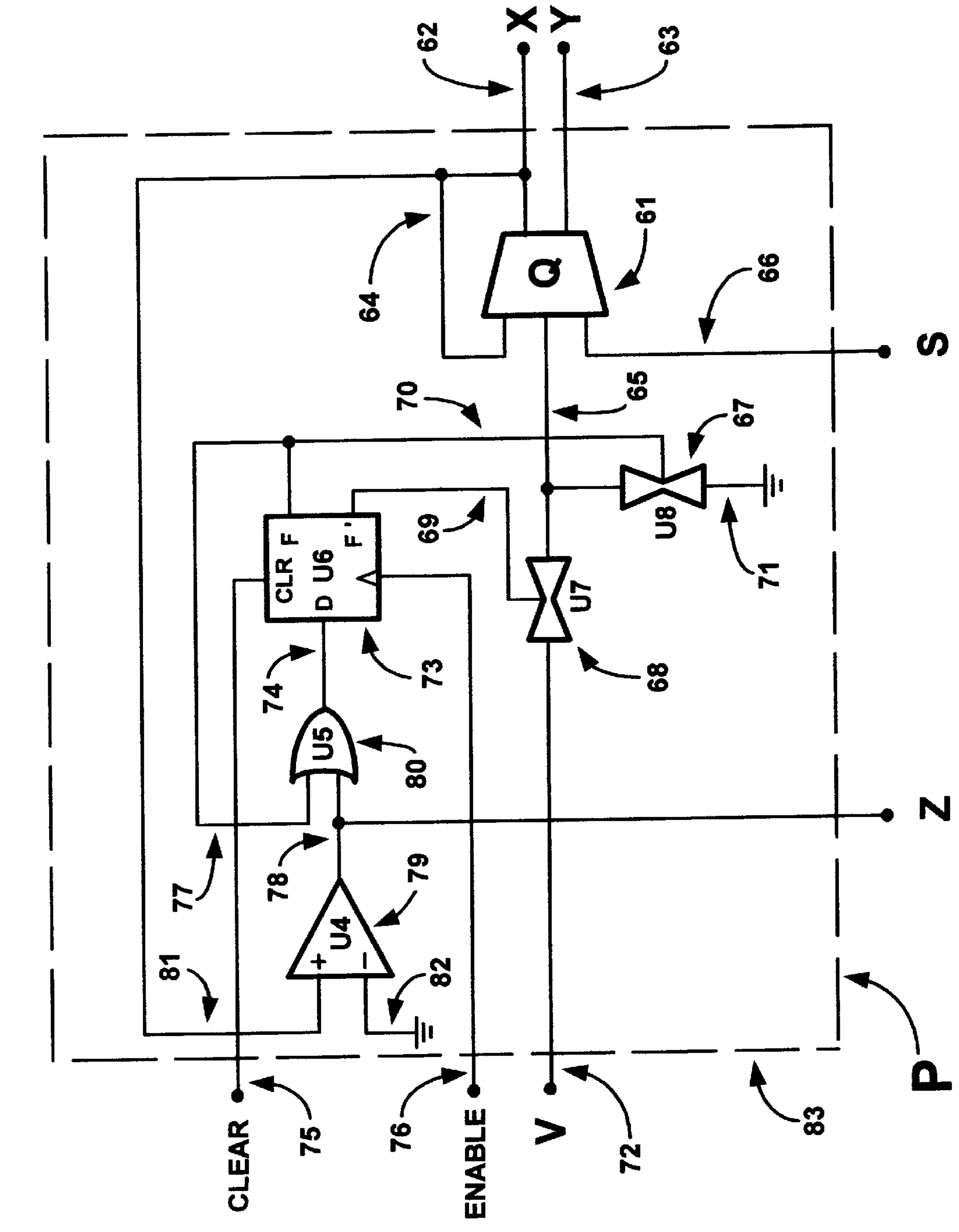
FIG. 6 is a circuit diagram of a P-element in accordance with an embodiment of the present invention.

Referring to FIG. 6, we augment an N=3 input Q-element 61 with analog connection and digital control circuitry. The resulting circuit 83 is labeled P and herein called a P-element. Here, one voltage source among the set of voltage sources to be sorted is connected to the input terminal 72, which is labeled with the analog voltage V. The Q-element output terminals 62 and 63 produce voltages X and Y, respectively in the same way as defined for the Q-element of FIG. 2.

One input terminal 64 of the Q-element 61 is connected to its output terminal 62. To another Q-element 61 input terminal 66 is applied the voltage S produced at terminal 93 by the summing means 92 of FIG. 7. To another input terminal 65 of said Q-element 61 is applied either zero volts or the voltage V applied at terminal 72. The voltage at terminal 65 is determined by the state of the analog bilateral switches 67, called U8, and 68, called U7. The control terminal 69 of U7 is connected to the logic signal F' output of data flip-flop 73, called U6, and the control terminal 70 of U8 is connected to the logic signal F output of data flip-flop 73. Therefore, if the logic signal F is logic 0, which occurs by applying a logic pulse to the CLEAR input terminal 75 of flip-flop 73, then the logic signal F' will be logic 1, and the analog switch 68 is closed to connect the input terminal 72 to the Q-element input terminal 65, and analog switch 67 is an open circuit between terminals 65 and 71. If the logic signal F is logic 1, which occurs by applying a logic pulse to the ENABLE input terminal 76 of flip-flop 73 while a logic 1 signal is applied to the flip-flop data input terminal 74, then the logic signal F' will be logic 0, and the analog switch 68 is an open circuit between terminals 72 and 65, and analog switch 67 connects terminals 65 and 71 so that zero volts is applied to the Q-element input terminal 65. The flip-flop input terminal 74 is connected to the output terminal of logic OR gate 80, which is labeled U5. One OR gate 80 input terminal 77 is connected to the flip-flop output terminal 70 that produces the logic signal F, and the other OR gate 80 input terminal 78 is connected to the output terminal of the comparator 79, which is labeled U4. The negative (inverting input) terminal 82 of the comparator 79 has zero volts applied to it, the positive (noninverting input) terminal 81 of the comparator 79 is connected to the output terminal 62 of the Q-element 61. The logic signal at terminal 78 is also a P-element output that is labeled with a Z.

To apply the voltage V at terminal 72 to the Q-element input terminal 65, a logic pulse must be applied at the CLEAR terminal 75. If the voltage X at terminal 62 is zero volts, then the comparator 79 output is logic 0, and a logic pulse applied at the ENABLE terminal 76 cannot cause the flip-flop 73 logic signal F to change from logic 0 to logic 1. If however, the voltage X at terminal 62 is positive, then the comparator 79 output is logic 1, and a logic pulse applied at the ENABLE terminal 76 will cause the flip-flop 73 logic signal F to become logic 1, which disconnects terminal 72 from terminal 65 and makes the voltage at terminal 65 zero volts. Thereafter, regardless of the voltage at terminal 62, the logic signal F at terminal 70 remains logic 1 with every subsequent logic pulse applied at the ENABLE terminal 76. The further utility of a P-element will become apparent as it is used in FIG. 7.

Figure 7:
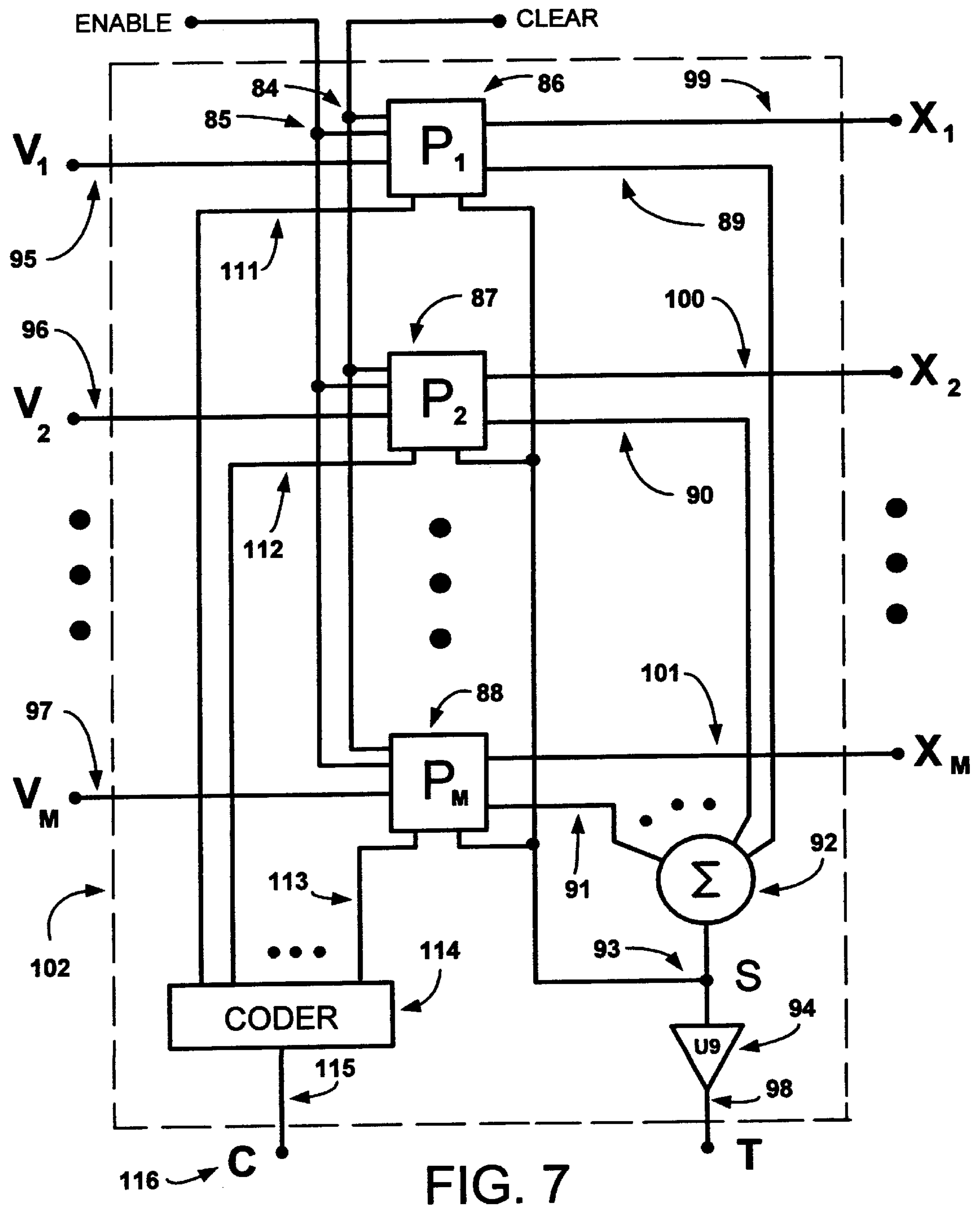
FIG. 7 is a diagram of a MAXOR circuit in accordance with a fourth embodiment of the present invention.

In FIG. 7 there is shown a sorting apparatus 102 having M analog input terminals, 95, 96, . . . , 97, to which can be applied the voltages $V_1$, $V_2$, . . . , $V_M$, and there are M output terminals, 99, 100, . . . , 101, that produce the voltages $X_1$, $X_2$, . . . , $X_M$. It uses a number M of P-elements, 86, 87, . . . , 88, where the P-elements are designated by $P_1$, $P_2$, . . . , $P_M$. Here, the first voltage $V_1$ is applied to the analog voltage input terminal 95, which is connected to the analog input terminal of $P_1$ like terminal 72 in FIG. 6. The voltage $V_2$ is applied to the analog input terminal of $P_2$ and so on through the last voltage $V_M$ that is applied to the analog input terminal of $P_M$.

The CLEAR logic inputs of all P-elements are connected to terminal 84. The ENABLE logic inputs of all P-elements are connected to terminal 85. To terminal 84, labeled CLEAR, and terminal 85, labeled ENABLE, can be applied logic pulses.

Within apparatus 102 there is a summing means 92 with M input terminals, 89, 90, . . . , 91, that are connected in a one-to-one way to the output terminals, like terminal 63 in FIG. 6, that produce the Y output voltages of the P-elements. The output terminal 93, the voltage of which is labeled S, of the summing means 92 is connected to terminals, like terminal 66 in FIG. 6, of each one of the M P-elements. Device 94 is a conventional inverting unity gain analog amplifier that produces at the output terminal 98 the voltage T given by $$T = -\sum_{i=1}^{M} Y_i = \sum_{i=1}^{M} X_i$$

Within apparatus 102 is a coder 114 having M input terminals, 111, 112, . . . , 113, that are connected in a one-to-one way to the logic signal output terminals, like terminal 78 in FIG. 6, that produce the logic signals, like the logic signal Z produced by the P-element of FIG. 6 from the M P-elements, 86, 87, . . . , 88. In operation, the M inputs of coder 114 will include at most only one input with the logic signal that is logic 1, while the M−1 other inputs of coder 114 will be logic signals that are logic 0. Within the coder 114 there is a means to output at the collection of terminals 115 a code 116 that is labeled C. Each code 116 uniquely identifies the input terminal, 95, or 96, . . . , or 102 having the voltage $V_1$, or $V_2$, . . . , or $V_M$, that equals the voltage T appearing at terminal 98.

Referring to FIG. 7, assume a set of M positive input voltages $V_1, V_2, \ldots, V_M$, have been applied to the M input terminals, and that among these said input voltages the voltage $V_k$ for some integer k in the range k=1, . . . , M is the maximum voltage.

To initiate finding the maximum voltage, a logic pulse must first be applied at the CLEAR input terminal 84. This establishes the same relationship between the input voltages $V_1, V_2, \ldots, V_M$, and the output voltages $X_1, X_2, \ldots, X_M$, of the MAXOR in FIG. 5. In addition, for the voltage at terminal 98 we have $T=V_k$, and the coder 114 output code 116 gives a code that uniquely identifies the input terminal to which the maximum voltage $V_k$ is applied.

Since the output voltage $X_k$, which corresponds to the input voltage $V_k$, is the only positive output voltage, while the other M−1 output voltages are zero volts, the application of a logic pulse at the ENABLE terminal 85 will replace with zero volts the value of $V_k$ at the input of the Q-element, like terminal 65 in FIG. 6, within P-element $P_k$. Then, assuming $V_j$ is the next smaller input voltage, the output voltages then settle to $X_j=V_j$, while the other M−1 output voltages are zero volts. In addition, for the voltage at terminal 98 we have $T=V_j$, and the coder 114 output code 116 gives the code of the input terminal to which the voltage $V_j$ is applied. With each subsequent logic pulse applied at the ENABLE terminal 85 the next smaller input voltage is found, the voltage T at terminal 98 gives this voltage, and the coder 114 gives the code of the corresponding input terminal.

After M−1 logic pulses have been applied at the ENABLE terminal 85, all positive input voltage sources and voltages have been sorted, and the application of an Mth logic pulse at the ENABLE terminal 85 results in $X_i=0$, for i=1, 2, . . . , M, while output T becomes zero, and all M inputs of coder 114 become logic 0. This condition could be used to trigger a logic pulse at the CLEAR terminal 84, and the sorting process can be started over again.

Figure 8:
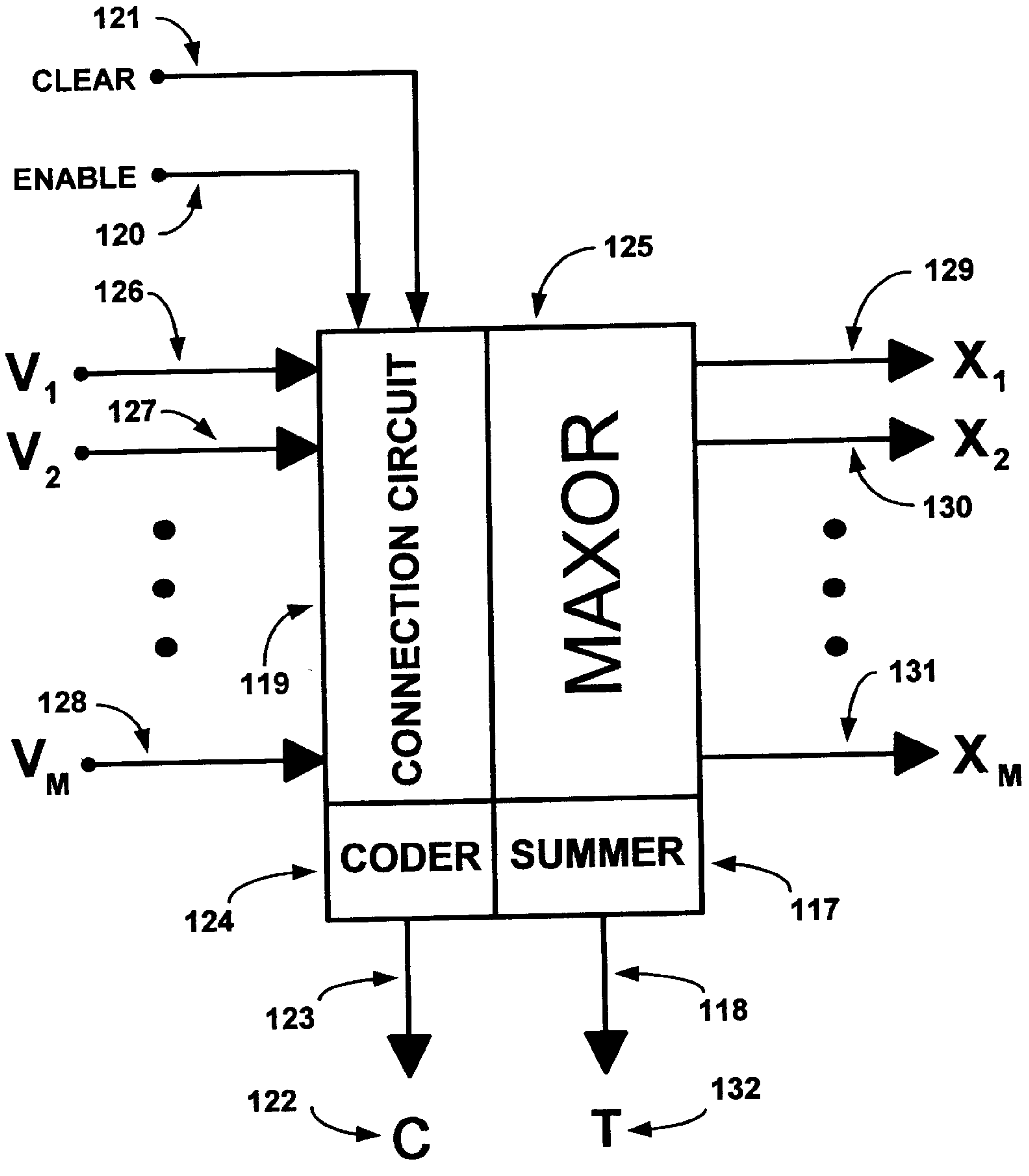
FIG. 8 is a diagram of a MAXOR circuit in accordance with a fifth embodiment of the present invention.

In FIG. 8 the analog sorting apparatus of FIG. 7 is summarized into a simple block diagram. The block diagram shows the M analog input terminals, 126, 127, . . . , 128, the M analog output terminals 129, 130, . . . , 131, the CLEAR logic signal control input terminal 121 that initializes the sorting process, the ENABLE logic signal control input terminal 120 that activates successive sorting of the analog inputs, the summer 117 that outputs at terminal 118 the input voltages sorted in descending value order, and the coder 124 that gives codes 122 at the logic output terminals 123 to identify the input terminal to which the voltage 132 appearing at terminal 118 is applied.

Identifying and outputting the largest voltage among a set of voltages in the range V-Neg to V-Pos, where V-Neg is a negative voltage and V-Pos is a positive voltage, can easily be accomplished with apparatus described herein if at least one input voltage is positive, and by using conventional signal conditioning to shift and scale the given set of voltages such that one or more become non-negative voltages prior to connection to the apparatus inputs and inverse conditioning of the apparatus outputs.

In sorting, negative voltage values among the apparatus inputs are treated as zero volts, and all positive voltages among the apparatus inputs are sorted by apparatus described herein. However, if all voltages in a set including negative voltage values are to be sorted, then the set must be conditioned to be positive within the range 0 to V-Pos prior to connection to the apparatus inputs and inverse conditioned at the apparatus outputs.

While the principles of the invention have been described above in connection with specific apparatus and applications, it is to be understood that this description is made by way of example only and not as a limitation on the scope of the invention.

We claim:

1. A circuit for identifying which of a plurality of input signals has a highest value, and for determining a value of the input signal that has the highest value, the circuit comprising:

a plurality of inputs, each input coupled to a respective one of the input signals;

a plurality of outputs, each output associated with a respective one of the inputs; and identifying means disposed between the inputs and the outputs for placing a highest output signal on the one of the outputs corresponding to the input coupled to the highest input signal, wherein the highest output signal value is substantially equal to the highest input signal, and for placing a remaining output signal value on the other of the outputs, wherein the remaining output signal value is predetermined.

2. The circuit of claim 1 wherein the remaining output signal value is substantially zero.

3. The circuit of claim 1 wherein the identifying means comprises:

a plurality of circuit modules, each circuit module comprising:

a plurality of circuit module inputs;

a first circuit module output and a second circuit module output, the first circuit module output and the second circuit module output providing signals having values of equal magnitude and opposite sign; and wherein one of the circuit module inputs is connected to an input and the remaining circuit module inputs are connected to the second circuit module outputs of other circuit modules.

4. A circuit comprising:

a plurality of inputs, each input having an input voltage;

a plurality of outputs, each output associated with an input and providing an output voltage; and a summer having a plurality of summer inputs and a summer output; and a plurality of circuit modules wherein the number of circuit modules equals the number of inputs, each circuit module comprising:

a plurality of circuit module inputs;

a first circuit module output having a first circuit module output voltage;

a second circuit module output providing a second circuit module output voltage being of equal magnitude and opposite sign of the first circuit module output voltage, the second circuit module output being connected to one of the summer inputs; and wherein one of the circuit module inputs is connected to an input, one of the circuit module inputs is connected to the first circuit module output and one of the circuit module inputs is connected to the summer output.

5. A circuit comprising:

a plurality of inputs, each input having an input voltage;

a plurality of outputs, each output associated with an input and providing an output voltage;

a plurality of circuit modules comprising:

a first circuit module input having a first circuit module voltage;

a second circuit module input having a second circuit module voltage;

a first circuit module output providing a first circuit module output voltage;

a second circuit module output having a second circuit output voltage being of equal magnitude and opposite sign of the first circuit module output voltage;

a logic signal output having a logic signal output voltage;

wherein the first module output voltage is a sum of the first module input voltage, the second module input voltage and the first module output voltage when the sum is greater than zero volts and a predetermined voltage when the sum is not greater than zero volts; and wherein the logic signal output voltage is a first voltage when the first module output voltage is greater than zero volts and a second voltage when the first module output voltage is not greater than zero volts;

a summer for summing the second circuit module output voltages and providing the sum to the second circuit module input of each circuit module; and a coder responsive to the logic signal output voltage of each circuit module for providing an address associated with the circuit module.

6. The circuit of claim 5 wherein a highest input voltage can be nullified in order to find a next highest input voltage.

7. A circuit for identifying a highest voltage of a plurality of voltages comprising:

a plurality of input terminals, each input having an input voltage;

a plurality of output terminals, each output terminal associated with an input terminal; and a highest voltage identifying means disposed between the input terminals and the output terminals for placing a first output voltage on the one of the output terminals corresponding to the input having the highest input voltage, wherein the first output voltage is substantially equal to the highest input voltage, and for placing a second output voltage on the other of the output terminals, wherein the second output voltage is a predetermined voltage.

8. The circuit of claim 7 wherein the highest voltage identification means comprises a plurality of Q-elements, each Q-element comprising:

N Q-element inputs having Q-element input voltages $W_1$, $W_2, \ldots, W_N$ applied thereto, where N is any positive integer greater than one;

a Q-element X output providing a voltage $V_x$ such that $$V_x = \begin{cases} \sigma, & \sigma > 0 \\ 0, & \sigma \le 0 \end{cases}$$

where $$\sigma = \sum_{i=1}^{N} W_i;$$

and a Q-element Y output providing a voltage $V_y$ such that $$V_y = -V_x.$$

9. The circuit of claim 8 wherein the number of Q-element inputs equals the number of input terminals.

10. The circuit of claim 9 wherein the Q-element inputs for each Q-element are electrically connected to:

an input terminal; and the Q-element Y output of each of the other Q-elements.

11. The circuit of claim 8 further comprising:

a summer for summing the Q-element Y outputs of the plurality of Q-elements and providing the sum on a summer output; and wherein the plurality of Q-element inputs comprises three Q-element inputs electrically connected to:

the Q-element's own X output;

one of the input terminals; and the summer output.

12. The circuit of claim 7 wherein the highest voltage identifying means comprises:

a plurality of P-elements, each P-element comprising:

a plurality of P-element inputs, each P-element having a P-element input voltage applied thereto;

an X output for providing an X output voltage which equals:

a sum of the P-element input voltages when the sum is greater than zero volts; and a zero volt output when the sum is less than zero volts;

a Y output for providing a Y output voltage which is of equal magnitude and opposite sign of the X output voltage; and a coder logic signal.

13. The circuit of claim 12 wherein the highest voltage identifying means further comprises:

a clear input, and an enable input.

14. A circuit for identifying a highest voltage of a plurality of voltages comprising:

a plurality of input terminals, each input having an input voltage;

an output terminal;

a highest voltage identifying means which determines the highest input voltage and provides an output voltage on the output terminal; and a coder output for providing an address of the input terminal having the highest input voltage.

15. The circuit of claim 14 wherein the output voltage equals the highest input voltage.

16. The circuit of claim 14 wherein the highest voltage identifying means comprises:

plurality of P-elements, each P-element comprising:

a plurality of P-element inputs, each P-element having a P-element input voltage applied thereto;

an X output for providing an X output voltage which equals:

the sum of the P-element input voltages when the sum is greater than zero volts; and a zero volt output when the sum is less than zero volts; and an Y output for providing a Y output voltage which is of equal magnitude and opposite sign of the X output voltage.

17. The circuit of claim 14 wherein the highest voltage identifying means further comprises:

a clear input, and an enable input.

18. A circuit comprising:

a first module input having a first module input voltage;

a second module input having a second module input voltage;

a first module output providing a first module output voltage;

a second module output providing a second module output voltage which is of equal magnitude and opposite sign of the first module output voltage;

a logic signal output providing a logic signal output voltage;

wherein the first module output voltage is a sum of the first module input voltage, the second module input voltage and the first module output voltage when the sum is greater than zero volts and a predetermined voltage when the sum is not greater than zero volts; and wherein the logic signal output voltage is a first voltage when the first module output voltage is greater than and the predetermined voltage and a second voltage when the first module output voltage is not greater than the predetermined voltage.

19. A circuit comprising:

N Q-element inputs having voltages $W_1, W_2, \ldots, W_N$ applied thereto, where N is any positive integer greater than 1;

a first Q-element output providing a voltage $V_x$ such that $$V_x = \begin{cases} \sigma, & \sigma > 0 \\ 0, & \sigma \leq 0 \end{cases}$$

where $$\sigma = \sum_{i=1}^{N} W_i$$

and a second Q-element output providing a voltage $V_y$ such that $$V_y = -V_x.$$

20. A method of sorting a plurality of input signals comprising the steps of:

providing a circuit having a plurality of inputs, each input having an input signal with an input signal strength;

providing a plurality of X outputs, each X output associated with a respective one of the inputs and having an X output signal with an X output signal strength; and sorting the input signals by input signal strength by:

a. placing a signal on the X output associated with the input having a highest input signal strength, wherein the X output signal strength is substantially equal to the input signal strength;

b. placing a predetermined signal on the remaining X outputs;

c. nullifying the input having the highest signal strength; and d. repeating steps a through c until the relative input signal strength of all of the inputs has been determined.

21. The method of claim 20 further comprising the steps of:

providing a multi-bit digital output; and additionally sorting the input signals by input signal strength by:

a. placing an address associated with the input having the highest input signal strength on the multi-bit digital output;

b. nullifying the input having the highest signal strength; and c. repeating steps a and b until the relative input signal strength of all of the inputs has been determined.

22. The method of claim 21 further comprising the steps of:

providing a single T output having a T output signal with a T output signal strength;

additionally sorting the input signals by input signal strength by:

a. placing a signal on the T output having a T output signal strength substantially equal to the highest input signal strength;

b. nullifying the input having the highest signal strength; and c. repeating steps a and b until the relative input signal strength of all of the inputs has been determined.

23. A method of sorting a plurality of input signals comprising the steps of:

providing a circuit having a plurality of inputs, each input having an input signal with an input signal strength;

providing a multi-bit digital output; and sorting the input signals by input signal strength by:

a. placing an address associated with the input having a highest input signal strength on the multi-bit digital output;

b. nullifying the input having the highest signal strength; and c. repeating steps a and b until the relative input signal strength of all of the inputs has been determined.

24. The method of claim 23 further comprising the steps of:

providing a single T output having a T output signal with a T output signal strength;

additionally sorting the input signals by input signal strength by:

a. placing a signal on the T output having a T output signal strength substantially equal to the highest input signal strength;

b. nullifying the input having the highest signal strength; and c. repeating steps a and b until the relative input signal strength of all of the inputs has been determined.

25. The method of claim 24 further comprising the steps of:

providing a plurality of X outputs, each X output associated with a respective one of the inputs and having an X output signal with an X output signal strength; and additionally sorting the input signals by input signal strength by:

a. placing a signal on the X output associated with the input having a highest input signal strength, wherein the X output signal strength is substantially equal to the input signal strength;

b. placing a predetermined signal on the remaining X outputs;

c. nullifying the input having the highest signal strength; and d. repeating steps a through c until the relative input signal strength of all of the inputs has been determined.

26. A method of sorting a plurality of input signals comprising the steps of:

providing a circuit having a plurality of inputs, each input having an input signal with an input signal strength;

providing a single T output having a T output signal with a T output signal strength;

sorting the input signals by input signal strength by:

a. placing an address associated with the input having a highest input signal strength substantially equal to a highest input signal strength;

b. determining a location of the input having the highest input signal strength;

c. nullifying the input having the highest signal strength; and d. repeating steps a and c until the relative input signal strength of all of the inputs has been determined.

27. The method of claim 26 further comprising the steps of:

providing a plurality of X outputs, each X output associated with a respective one of the inputs and having an X output signal with an X output signal strength; and additionally sorting the input signals by input signal strength by:

a. placing a signal on the X output associated with the input having a highest input signal strength, wherein the X output signal strength is substantially equal to the input signal strength;

b. placing a predetermined signal on the remaining X outputs;

c. nullifying the input having the highest signal strength; and d. repeating steps a through c until the relative input signal strength of all of the inputs has been determined.

28. The method of claim 27 further comprising the steps of:

providing a multi-bit digital output; and additionally sorting the input signals by input signal strength by:

a. placing an address associated with the input having a highest input signal strength on the multi-bit digital output;

b. nullifying the input having the highest signal strength; and c. repeating steps a and b until the relative input signal strength of all of the inputs has been determined.

* * * * *